US008754720B2

(12) United States Patent
Yan et al.

(10) Patent No.: US 8,754,720 B2
(45) Date of Patent: Jun. 17, 2014

(54) TWO-STAGE PULSE SIGNAL CONTROLLER

(76) Inventors: Mi Yan, Columbus, IN (US); Baohua Qi, Columbus, IN (US)

( * ) Notice: Subject to any disclaimer, the term of this patent is extended or adjusted under 35 U.S.C. 154(b) by 49 days.

(21) Appl. No.: 13/566,994

(22) Filed: Aug. 3, 2012

(65) Prior Publication Data

US 2013/0033304 A1 Feb. 7, 2013

Related U.S. Application Data

(60) Provisional application No. 61/574,469, filed on Aug. 3, 2011.

(51) Int. Cl.
*H03K 7/08* (2006.01)
*H03K 3/017* (2006.01)
*G05B 11/28* (2006.01)

(52) U.S. Cl.
USPC ............ 332/109; 318/599; 327/172; 375/238

(58) Field of Classification Search
USPC ........... 318/599; 327/172; 332/109; 375/238; 700/14, 296
See application file for complete search history.

(56) References Cited

U.S. PATENT DOCUMENTS 3,706,923 A * 12/1972 Dunfield .................. 318/400.11
3,708,765 A * 1/1973 Salamon et al. .............. 332/110
4,763,052 A * 8/1988 Lundin et al. ............ 318/400.17
5,162,987 A 11/1992 Sambhu
5,202,951 A 4/1993 Doyle
5,241,251 A * 8/1993 Wakui ........................... 318/599
5,256,949 A * 10/1993 Reichard et al. ......... 318/400.01
5,739,664 A * 4/1998 Deng et al. .................... 318/808
5,771,861 A 6/1998 Musser et al.
5,857,589 A 1/1999 Cline et al.
5,901,176 A * 5/1999 Lewison ....................... 375/238
6,029,527 A 2/2000 Seitz et al.
6,052,035 A * 4/2000 Nolan et al. .................... 331/74
6,226,324 B1 5/2001 Allstrom
6,259,220 B1 7/2001 Hays et al.
6,400,116 B1 * 6/2002 Chen et al. .................... 318/599
6,404,612 B1 6/2002 Pattantyus
6,520,930 B2 2/2003 Critchlow et al.
6,712,084 B2 3/2004 Shajii et al.
6,882,924 B2 4/2005 Miller
6,979,988 B2 12/2005 Sutardja
7,024,254 B2 4/2006 Salsbury et al.
7,053,594 B2 5/2006 Sutardja
7,069,137 B2 6/2006 Miller
7,073,392 B2 7/2006 Lull et al.
7,102,322 B2 * 9/2006 Suzuki .......................... 318/801
7,119,508 B2 * 10/2006 Kurosawa et al. ....... 318/400.04
7,273,063 B2 9/2007 Lull et al.
7,434,477 B2 10/2008 Lull et al.
7,536,996 B2 5/2009 Nagai
7,554,372 B1 * 6/2009 Wong ............................ 327/172
7,629,823 B2 12/2009 Wang
7,784,447 B2 8/2010 Ricco et al.

(Continued)

*Primary Examiner* — Levi Gannon

(57) ABSTRACT

An apparatus and method for controlling a device using pulse signals. In the apparatus and method, a two-stage control is used to generate pulse signals, which can be a PWM signal, a pulse signal including a PWM signal with a sleeping time, or a PDM signal. The two-stage control includes a second stage control, which generates pulse signals according to parameter values generated periodically by a first stage according to a target value and feedback sensing values. The two-stage control can be used in decreasing perturbation in a closed-loop control and accurate open-loop control.

19 Claims, 16 Drawing Sheets

(56) References Cited

U.S. PATENT DOCUMENTS

| | | | |
|---|---|---|---|
| 7,880,523 | B2 | 2/2011 | Wang |
| 7,906,949 | B1 | 3/2011 | Sutardja et al. |
| 2004/0144423 | A1 | 7/2004 | Everett |
| 2008/0245058 | A1 | 10/2008 | Boddy et al. |
| 2009/0149743 | A1 | 6/2009 | Barron et al. |
| 2009/0255246 | A1 | 10/2009 | Wu et al. |
| 2009/0269211 | A1 | 10/2009 | Matsutani |
| 2010/0242439 | A1 | 9/2010 | Domon et al. |
| 2010/0324743 | A1 | 12/2010 | Shajii et al. |

* cited by examiner

TWO-STAGE PULSE SIGNAL CONTROLLER

CROSS-REFERENCE TO RELATED APPLICATIONS

Not Applicable

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

FIELD OF THE INVENTION

This present application claims priority from U.S. provisional application No. 61/574,469 having the same title as the present invention and filed on Aug. 3, 2011.

This invention relates to apparatus and methods for driving an actuator using pulse control signals.

BACKGROUND OF THE INVENTION

Pulse signals, such as pulse-width modulated (PWM) signals and pulse-duration modulated (PDM) signals, are used in controlling power applied to inertial devices and directly controlling average values, e.g. average flow-rate. A PWM or PDM signal is determined by two parameters: a PWM period and an on-time or duty cycle, which is the ratio of the on-time to the PWM period. Normally, in an application, the PWM period value in a PWM signal is a constant and is much lower than the time constant of the inertial device driven by the PWM signal, while in a PDM signal, the on-time value is fixed, and the period value is determined by the duty cycle value.

In addition to the parameters of pulse control signals, in a system with pulse control, there is a third factor, full-scale level, affecting control performance. The full-scale level is the control level during the on-time of a pulse signal. For example, in an electrical heater with PWM power control, the full-scale level is the electrical power delivered to the heater during the on-time of a PWM control signal, while in a system with a flow rate controlled by switching on and off a control valve with a PWM signal, the full-scale level is the flow rate when the control valve is switched on. The full-scale level together with duty cycle determines the average value controlled by a pulse signal.

In a feed-forward pulse control system, normally, a required duty cycle is generated based on a desired output value (target value), and then a pulse control signal is generated accordingly. If the full-scale level is constant and the calculation for duty cycle is accurate, then the control is accurate if there is no perturbation in the plant, i.e., there is no parameter change in the plant. However, due to variation in the full-scale level and perturbation in the plant, the actual output value may not equal to the target value. For example, in an electrical heater-temperature PWM control, if the driving voltage is not constant, then the actual power output varies even the duty-cycle of the PWM control is controlled constant and there is no change in heater resistance. In a flow-rate control, if the driving pressure changes, then the actual flow rate changes with the same valve open time even there is no change in other parameters such as nozzle shape and size.

A feedback control, which compares an output sensing value to a target value, and then adjusts the pulse signal accordingly, can be used to decrease the effects of variation in the full-scale level and other plant parameter changes. However, normally the feedback controller is designed for a nominal plant assuming constant plant parameter values. As a result, the variation in the full-scale level, and other plant parameter changes are perturbations to the control system. If the perturbations are much slower than the plant dynamics and the variation of plant parameters is small, then normally the feedback controller is able to correct the error caused by the variation and effectively decrease its effects. However, if the variation is large, then there would be a significant perturbation in the control system, while if the variation is fast, even it is small, it is a noise to the control system. Though for the perturbations, increasing the robustness of the feedback controller helps improving the stability of the system, and narrowing the band-width of the feedback controller de-sensitizes the system to the noise, all these methods lead to deterioration of the control performance.

In systems requiring accurate controls, variations in plant parameters need to be controlled small. However, to keep the variations small, in addition to decreasing plant sensitivity to influencing factors, a high precision driving source is also needed. For example, in an electrical heater-temperature PWM control system, a high precision voltage supply and a heater with low temperature coefficient are required for accurate temperature control, and in a flow-rate control system, a high precision driving pressure is needed. The high precision driving source and robust plant insensitive to influencing factors increase system cost and sometimes are not available. To solve this problem, a primary object of the present invention is to provide a control means to compensate the variation in the full-scale level and other plant parameters in the control loop and thereby eliminate its effects.

A further object is to include the control means into the pulse signal generation, so that the compensation to the variation in the full-scale level and other plant parameters won't increase the complexity of the system control, which provides commands to the pulse signal generation.

A further object is to generate a high precision pulse signal the precision of which is independent to the compensation of the control means added into the pulse generation.

BRIEF SUMMARY OF THE INVENTION

The present invention provides an apparatus and method for controlling a device with pulse signals to reach a target value. More specifically, the apparatus includes sensors, a pulse signal generator, and a pulse control unit commanding the pulse signal generator using sensing values obtained from the sensors and the target value. In one embodiment of the present invention, a first stage PWM signal is generated with the pulse control unit periodically commanding the pulse signal generator, which generates a second stage PWM signal. In each cycle of the first stage PWM signal, the difference between a current control value, which is calculated using the sensing values, and the target value is used to determine values of control parameters to be set for the pulse signal generator. A fault is reported when the PWM signal is not capable to drive the device, i.e., at full capacity of the PWM signal, the device is not able to reach the target value.

A water tank temperature control system is used as an example for applications of the two-stage PWM control. In the water tank temperature control system, the target value is the energy to be generated in a PWM pulse, while the current control value is the energy already generated. A voltage analog-to-digital converter (ADC) and a current ADC are used to calculate the current control value. By adjusting the PWM signal using the error calculated from the target value and the current control value, variations in heater resistance and applied voltage are compensated. Thereby in system level closed-loop control, the closed-loop controller just needs to control a nominal plant with perturbation compensated, resulting in a better control performance.

Another exemplary application of the two-stage PWM control is a common rail flow rate control system, in which the target value is the amount of working fluid to be injected in a PWM pulse, and the current control value is the amount of working fluid that has been injected. The current control value can be calculated using either rail pressure sensing value or directly using the sensing value obtained from a flow sensor if it is available. The error between the current control value and the target value is then used in commanding the second stage PWM signal for compensating perturbation caused by variations in rail pressure.

The two-stage PWM control actually "cuts" the first stage PWM signal into pieces, each of which is a second stage PWM signal. In this way, the control is able to react quickly compensating fast changes in perturbation factors, such as applied voltage and heater resistance in the tank water temperature control system and rail pressure in the common rail pressure control system. At the same time, the precision of PWM control can be improved by the high PWM frequency of the second stage PWM signal. The two stage control method needs not be limited just to PWM signals. The same benefits can be obtained with other types of pulse signals. In another embodiment of the present invention, a pulse signal generator that adds a sleep section to a PWM signal is provided. The sleep section changes the duration of the result pulse signal, which is no longer a PWM signal. Thereby the error in the on-time period of a pulse cycle can be corrected in the current cycle rather than in the next cycle as that in a two-stage PWM signal controller. When a constant on-time value is commanded, the signal generated by this two-stage pulse signal controller is a pulse duration modulated (PDM) signal.

DETAILED DESCRIPTION OF THE INVENTION

Figure 1:
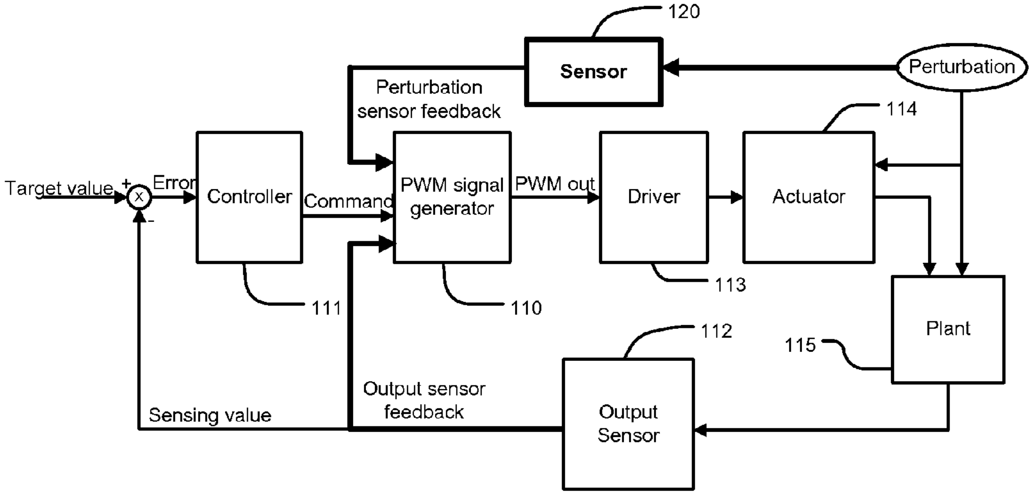
FIG. 1 (PRIOR ART)
FIG. 1 is a block diagram of a general closed-loop control system using pulse signal to drive an actuator.

In a control system shown in FIG. 1, a control signal is generated by a pulse signal generator 110 for a driver 113 to switch on and off an actuator 114 in the control loop. The actuator 114 provides controls to a plant 115, and an output sensor 112 is used to monitor the output of the plant. The sensing value obtained from the output sensor 112 is compared to a target value, and the difference or error between the target value and the sensing value is used by a controller 111 in generating command signals to the pulse signal generator 110. Such a control system is broadly used in controlling power to inertial devices and flow rate controls. In this control system, normally the pulse control signal provided to the actuator 114 can be generated accurately. However, in the actuator 114 and the plant 115, perturbation may exist causing changes in parameter values and deterioration in system control performance. To increase the robustness and performance of the system, a perturbation sensor 120 together with the output sensor 112 are used to detect the changes in parameter values and the sensing signals are provided to the pulse signal generator 110 for compensating the changes.

Figure 2A:
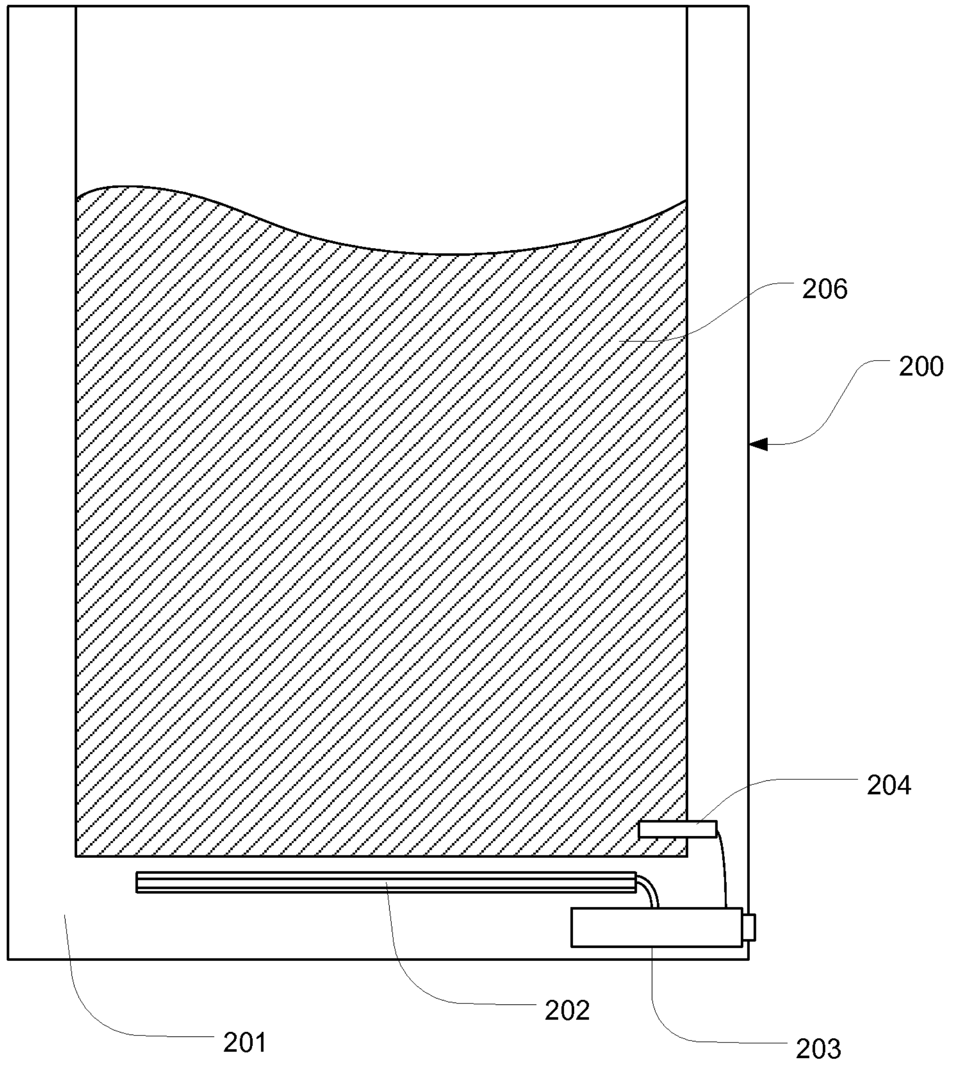
FIG. 2*a* shows a water tank temperature control system, in which a pulse signal is used in heating control.
Figure 2B:
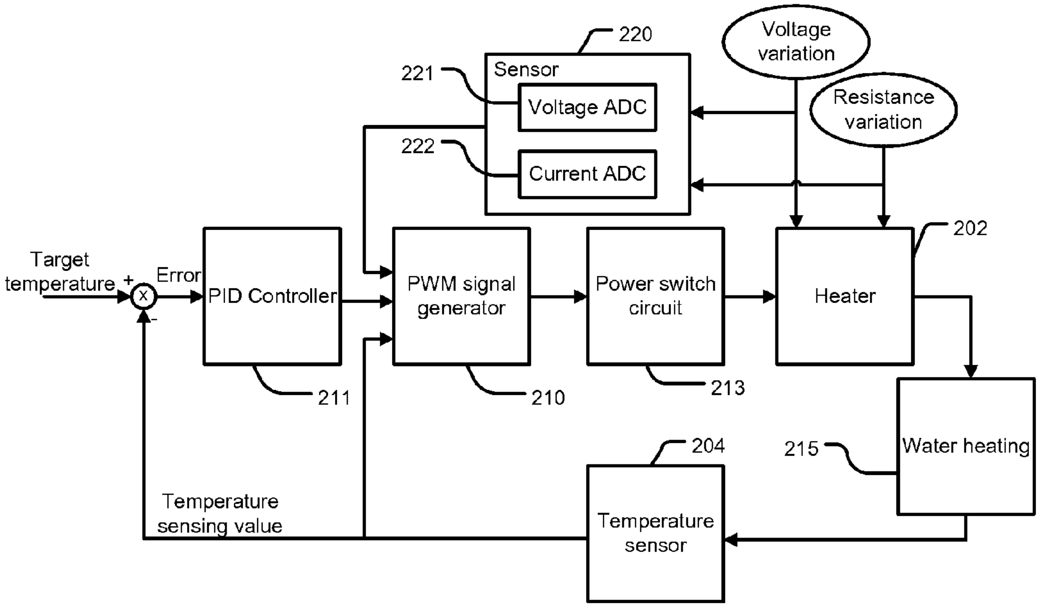
FIG. 2*b* is a block diagram of the control system shown in FIG. 2*a*.

An exemplary application of the controls system depicted in FIG. 1 is a tank temperature control system. Referring to FIG. 2*a*, a tank temperature control system 200 includes a tank container 201, an electrical heater 202, a controller 203, and a temperature sensor 204. According to the temperature sensing values obtained from the temperature sensor 204 and a target temperature value, the controller 203 generates a control signal and provides a driving voltage to the heater 202. A control scheme of the tank control system 200 is depicted in FIG. 2*b*. In the control system, a PID controller 211 is used to provide commands, which may include an on-time and a pulse period, to a pulse signal generator 210, which generates a control signal to a power switch circuit 213. Driving voltage is applied to the heater 202 under the control of the power switch circuit 213, and thereby a water 206 inside the tank container 201 is heated. Water temperature is measured through the temperature sensor 204 and the temperature sensing value is compared with a target value. The error between the sensing signal and the target value is then used by the PID controller 211 in generating controls signals. The transfer function between the water temperature and the heating power generated by the heater 202 is included in a plant 215.

In water temperature control, the PID controller 211 is tuned based on a nominal transfer function from the average heater heating power $\tilde{P}_0$ to the water temperature $T_0$:

$$T_0=f_0(\tilde{P}_0) \quad (1),$$

and the average heater heating power $\tilde{P}_0$ is a function of the pulse on-time $t_o$ and the period $S_o$ commanded by the PID controller 211:

$$\tilde{P}_0 = \frac{\int_0^{t_0} V_0^2 / R_0 \, dt}{S_0}, \tag{2}$$

where $V_0$ and $R_0$ are nominal values of applied voltage and heater resistance. In a PWM control, the period $S_o$ is a fixed value, while in a PDM control, the on-time $t_o$ is constant. Combining equations (1) and (2), we have the transfer function between $t_o$ and $T_0$:

$$T_0 = f_0\left(\frac{\int_0^{t_0} V_0^2 / R_0 \, dt}{S_0}\right) \tag{3}$$

However, in actual applications, variations exist in the transfer function $f_0$, the applied voltage $V_0$, and the heater resistance $R_0$, resulting in a different transfer function:

$$T = f\left(\frac{\int_0^{t_0} V^2 / R dt}{S_0}\right), \tag{4}$$

where f, V, and R are, respectively, the transfer function, the applied voltage, and the heater resistance with variations. The change in the relation between the duty cycle and the water temperature results in a perturbation to the control system and affects control performance. To compensate for the change, a sensor 220, which includes a voltage monitor 221 and a current monitor 222, is used to measure the changes in the applied voltage and heater resistance, and the perturbation sensing values are fed into the pulse signal generator 210 together with the output sensing values obtained from the temperature sensor 204. Inside the pulse signal generator 210, a compensation section is added in between the on-time and period outputs of the PID controller 211 and the inputs to the power switch circuit 213, creating functions:

$$t = g_a(t_0) \tag{5a}$$

$$S = g_b(S_0) \tag{5b},$$

where t and S are, respectively, the on-time and period inputs of the power switch circuit 213. The functions $g_a$ and $g_b$ in equations (5a) and (5b) are designed to make the temperature output in equation (4) equals to that in equation (3), i.e., $$T_0 = f_0\left(\frac{\int_0^{t_0} V_0^2 / R_0 \, dt}{S_0}\right) = f\left(\frac{\int_0^{t} V^2 / R dt}{S}\right) = f\left(\frac{\int_0^{g_a(t_0)} V^2 / R dt}{g_b(S_0)}\right). \tag{6}$$

In this way, the plant to the PID controller is kept nominal, and thereby control performance is not affected by perturbations.

Compared to the common controls structure shown in FIG. 1, the PID controller 211 if FIG. 2*b* is an embodiment of the feedback controller 111, while the driver 113 is the power switch circuit 213, and the actuator 114 is the heater 202. The plant 115 is the water heating 215 and the output sensor 112 is the temperature sensor 204. The perturbation in the system of FIG. 2*b* is caused by variations in applied voltage and heater resistance, and the variations are compensated using a sensor including a voltage monitor and a current monitor.

Figure 3A:
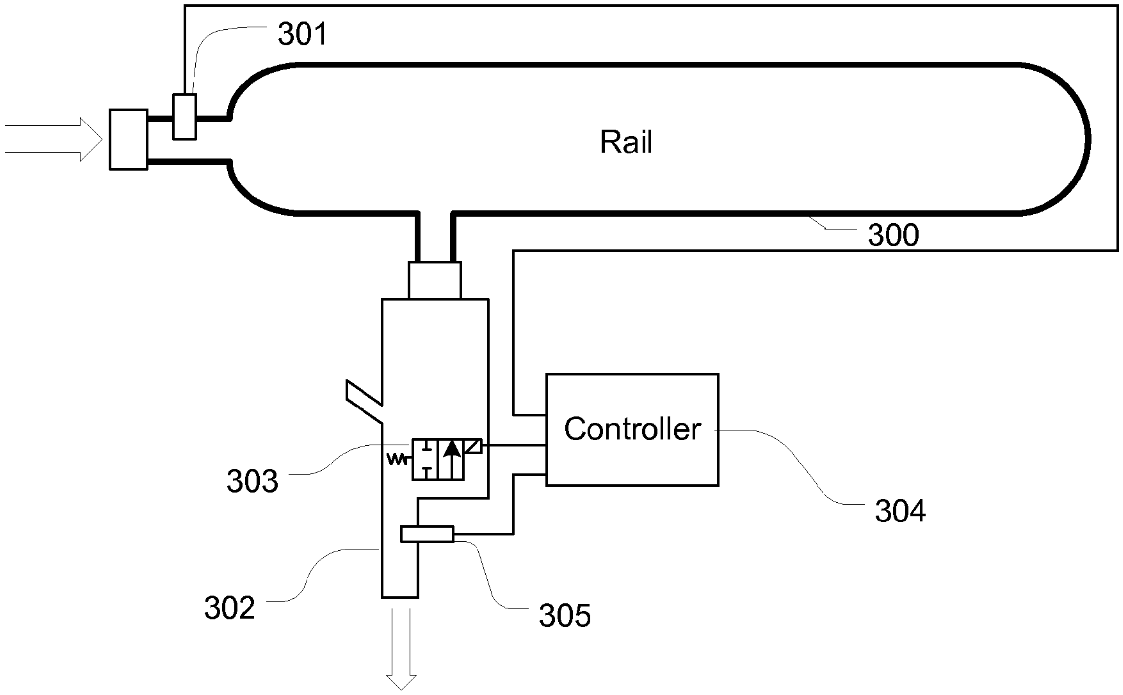
FIG. 3*a* shows a common rail flow rate control system, in which a pulse signal is used to control a solenoid valve.

Another exemplary application is a common rail flow control system. Referring to FIG. 3*a*, in such a system, working fluid is pumped into a rail 300 and a high pressure is created. An injector 302 with a solenoid valve 303 is connected to the rail 300 to control flow rate of the working fluid. The solenoid valve 303 is controlled by a controller 304. When the solenoid valve 303 is energized, the valve opens and working fluid flows out of the rail 300 under the high pressure inside the rail. The solenoid valve 303 is shut off when it is de-energized. The flow rate of the working fluid is controlled by adjusting the average open time of the solenoid valve 303 with a pulse signal generated by the controller 304. And a flow rate sensor 305 is connected to the controller 304 for providing flow rate sensing signals, which are used in controlling flow rate at a target value. In the control system, the pressure inside the rail determines the full-scale level of the flow rate. To compensate for the variations of the pressure, a pressure sensor 301 is used to provide pressure sensing values to the controller, where the pulse control signal is adjusted with the measured pressure values.

Figure 3B:
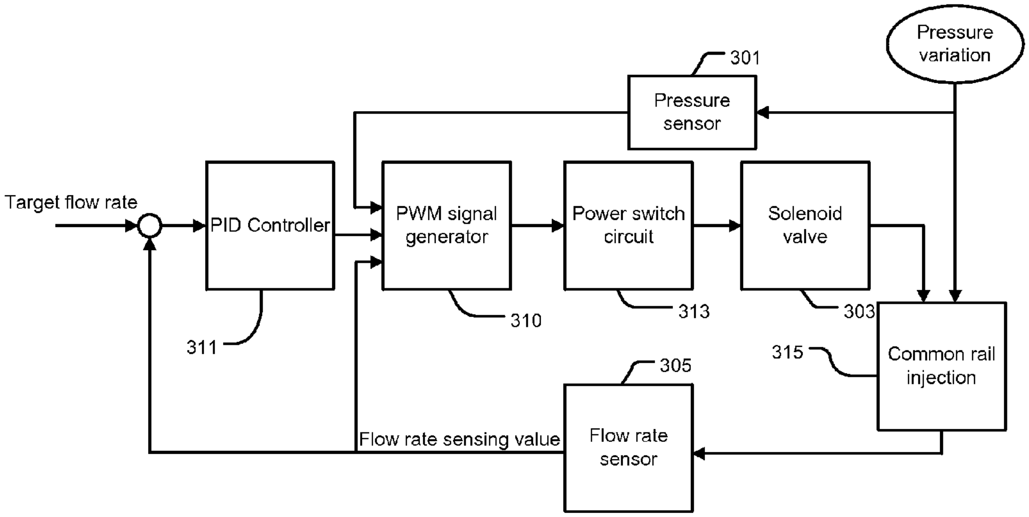
FIG. 3*b* is a block diagram of the common rail flow rate control system shown in FIG. 3*a*.

A controls scheme of the common rail flow control system is depicted in FIG. 3*b*. In this control system, a PID controller 311 is used to provide commands, which may include an open-time and a pulse period, to a pulse signal generator 310, which generates a control signal to a power switch circuit 313. Driving voltage is applied to the solenoid valve 303 under the control of the power switch circuit 313, and thereby the flow rate of working fluid being compressed out of the rail 300 is controlled. The average flow rate is measured using a flow rate sensor 305 and the flow rate sensing value is compared with a target value. The error between the sensing value and the target value is then used by the PID controller 311 in generating controls signals. The transfer function between the average flow rate and the average open time of the solenoid valve 303 is included in a plant 315.

In flow rate control, basically the average flow rate of working fluid, $\dot{m}_{af}$, is a proportional to the square root of the difference between the rail pressure $P_r$ and the pressure $P_c$ in the fluid chamber into which the working fluid is injected, and the relation is approximately governed by the following equation:

$$\dot{m}_{af} = \frac{\int_0^{t_0} C_D A_n \sqrt{2\rho(P_r - P_c)} \, dt}{S_0}, \tag{7}$$

where $t_o$ is the pulse on-time, $S_o$ the pulse period, $C_D$ the discharge coefficient, $A_n$ the nozzle minimum area, and ρ the working fluid density.

Normally, the fluid chamber pressure $P_c$ is very small compared to the rail pressure $P_r$, and the perturbation to the control system mainly comes from fast changing variations in $P_r$ and slow degradation in the nozzle minimum area $A_n$. To decrease the effects of the variations, the pressure sensor 301 is used to measure the changes in rail pressure, and the sensing values are fed into the pulse signal generator 310 together with the output sensing values to compensate the variations.

Inside the pulse signal generator 310, a compensation section is added in between the on-time and period outputs of the PID controller 311 and the inputs to the power switch circuit 313, creating functions:

$$t = h_a(t_0) \tag{8a}$$

$$S = h_b(S_0) \tag{8b},$$

where t and S are, respectively, the on-time and the pulse period inputs of the power switch circuit 313. The functions $h_a$ and $h_b$ in equations (8a) and (8b) are designed to keep the plant to the PID controller nominal, i.e. when a fixed period $S_0$ is used (PWM signal), $$\int_0^{t0} C_D A_n \sqrt{2\rho(P_r - P_c)}\,dt = \int_0^{t} C'_D A'_n 2\rho'(P'_r = P_c)\,dt = \int_0^{h(t0)} C'_D A'_n \sqrt{2\rho'(P_r - P_c)}\,dt \quad (9),$$

where variables with apostrophe are the ones with variations. Thereby the system control performance is not affected by perturbations.

Compared to the common controls structure shown in FIG. 1, the PID controller 311 in FIG. 3*b* is an embodiment of the feedback controller 111, while the driver 113 is the power switch circuit 313, and the actuator 114 is the solenoid valve 303. The plant 115 is the common rail injection 315 and the output sensor 112 is the temperature sensor 305. The perturbation in the system of FIG. 3*b* is caused by variations in rail pressure, and the variations are measured with the pressure sensor 301.

Figure 4:
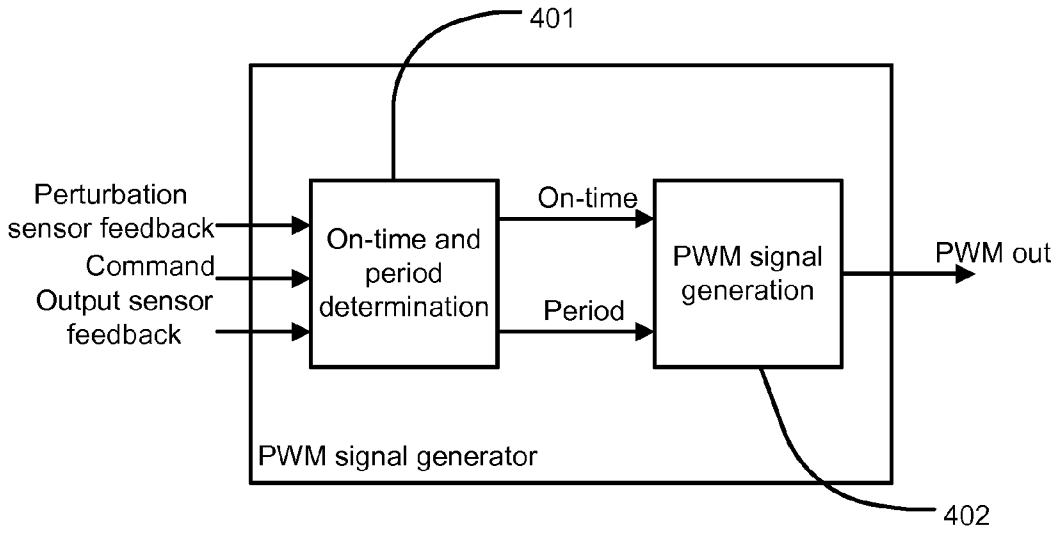
FIG. 4 is a block diagram of a pulse signal controller.
Figure 5A:
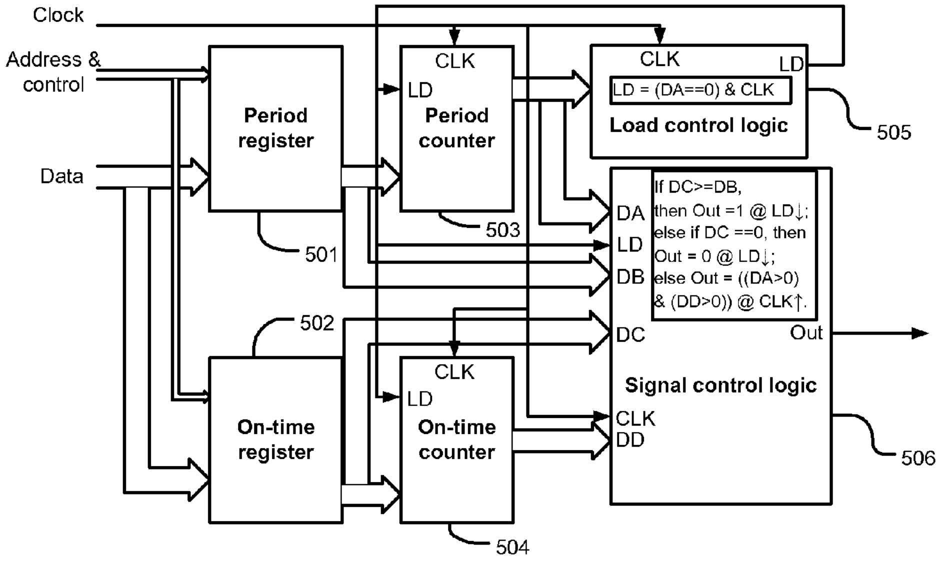
FIG. 5*a* shows a block diagram with signal flow chart of a PWM signal generation circuit.
Figure 5B:
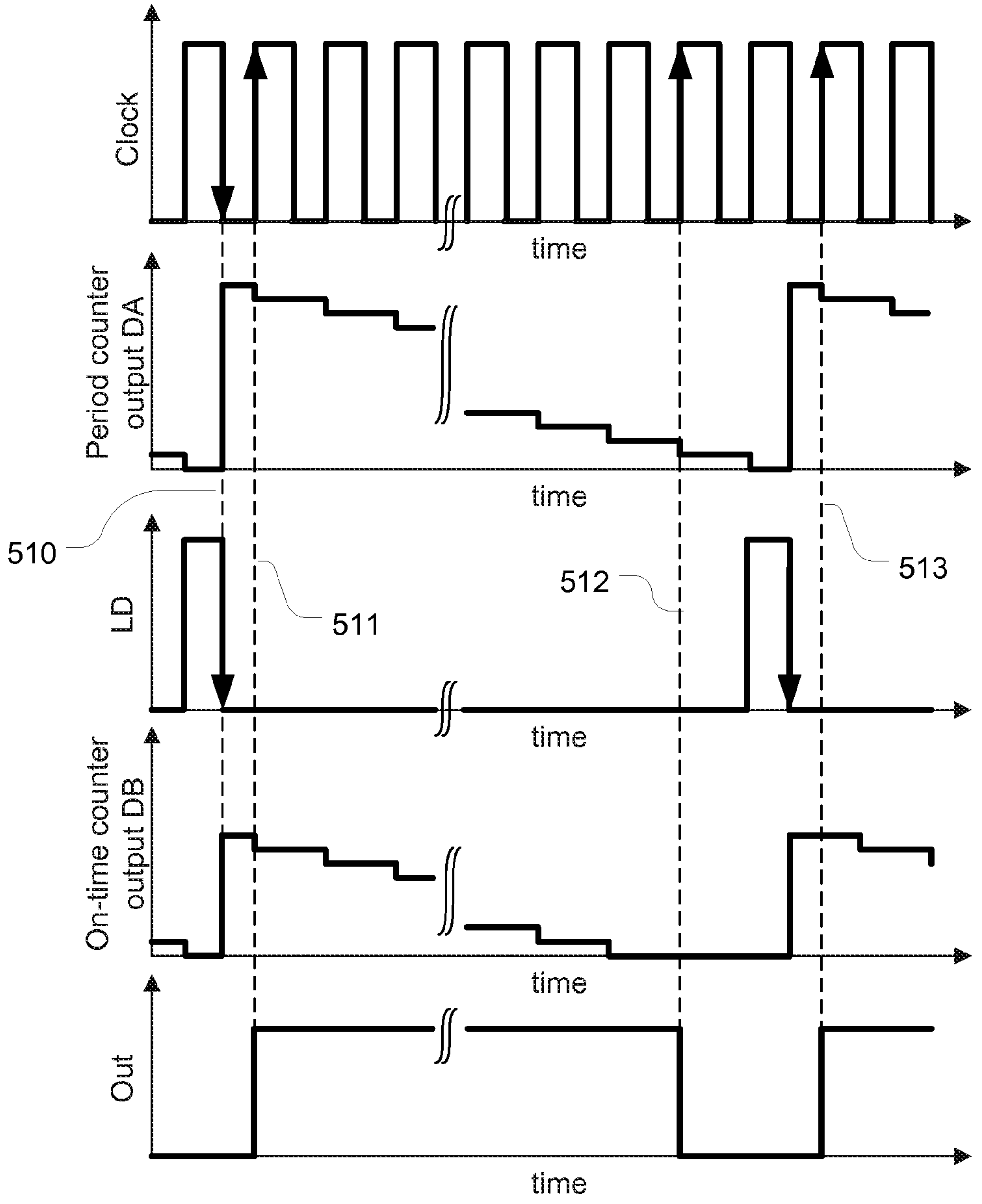
FIG. 5*b* is a timing chart of signals in the PWM signal generation circuit of FIG. 5*a*.

Referring back to FIG. 1, functionally, the pulse signal generator 110 normally includes a pulse control block 401 and a PWM signal generation block 402 as shown in FIG. 4. In the pulse control block 401, values of the pulse control parameters are determined, and in the pulse signal generation block 402, a pulse signal is generated according to the parameter values. In the block 402, a variety of circuits can be used for generating pulse signals. An example of a PWM generation circuit is depicted in FIG. 5*a*. In this circuit, period and on-time values of a PWM signal are set to a period register 501 and an on-time register 502 respectively. Upon the falling edge of a LD signal, the values in the period register 501 and the on-time register 502 are further, respectively, loaded in a period counter 503 and an on-time counter 504. Both of the period counter 503 and the on-time counter 504 are counting down counters and a clock signal synchronizes their counting actions. When the period counter 503 counts to 0, in a load control logic 505, a LD pulse is generated with the clock signal, and a new cycle starts at the falling edge of the LD pulse. The period counter value DA, the LD signal, the period register value DB, the clock signal, the on-time register value DC, and the on-time counter value DD are used in a signal control logic 506 for generating the PWM signal. In the signal control logic 506, if DC is equal or greater than DB, i.e., the on-time register setting value is equal or greater than the period register setting value, then a high level signal or 100% duty cycle PWM signal is generated upon the falling edge of the LD signal. When DC is set to 0, then a low level signal, i.e., 0% duty cycle PWM signal is generated at the falling edge of the LD signal. If DC is in between 0 and DB, then at the rising edge of the clock signal, the PWM signal is the output of an "AND" logic with inputs of two pulses, which are generated, respectively, when the period counter and the on-time counter values, DA and DB, are greater than 0. A timing chart of the PWM signal generation circuit of FIG. 5*a* is shown in FIG. 5*b*. This timing chart illustrates the signals when DC is in between 0 and DB. At a moment 510, a falling edge of the LD signal loads the period and on-time values into the period counter 503 and the on-time counter respectively. After half cycle of the clock signal, at a moment 511, in the signal control logic, a rising edge of the clock signal triggers a PWM pulse, which ends at a moment 512 upon another rising edge of the clock signal. The PWM cycle ends before another PWM pulse is triggered, and the duty cycle is the ratio between the time period from the moment 511 to the moment 512, and that from the moment 511 to the moment 513.

Figure 6A:
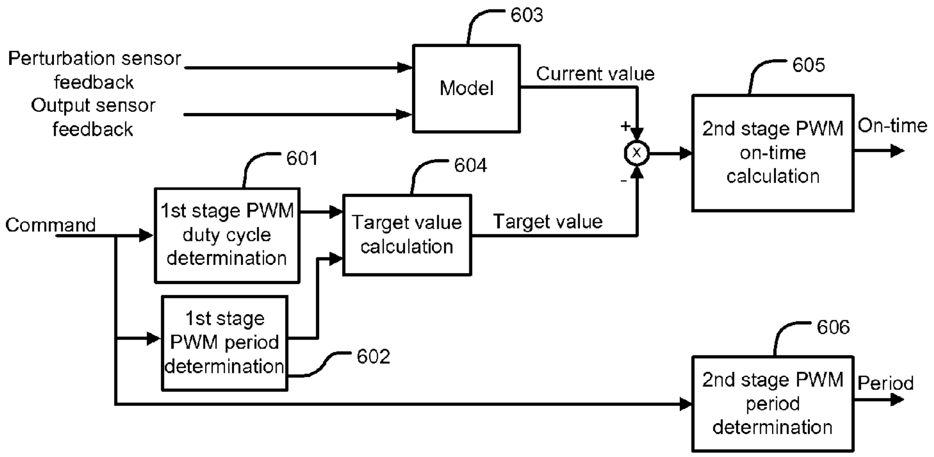
FIG. 6*a* is a block diagram of an on-time and period determination control for generating control parameters of a second stage PWM signal.

In a PWM control, the pulse control block 401 in FIG. 4 includes two stages. As shown in FIG. 6*a*, the first stage is determined by the commands provided by the controller 111 (not shown in FIG. 4 and FIG. 6*a*). Upon receiving the commands, in blocks 601 and 602, the duty cycle and the pulse period of the first stage PWM signal are calculated and provided to a block 604, where a target value is determined. The target value is compared with a current value calculated with the sensor feedback value provided by the sensor 120 (FIG. 1) and the output feedback value generated by the output sensor 112 (FIG. 1) in a model block 603. The result error value is then used by a block 605 to calculate the on-time setting value. And the period setting value for the second stage PWM signal is determined in a block 606.

Figure 6B:
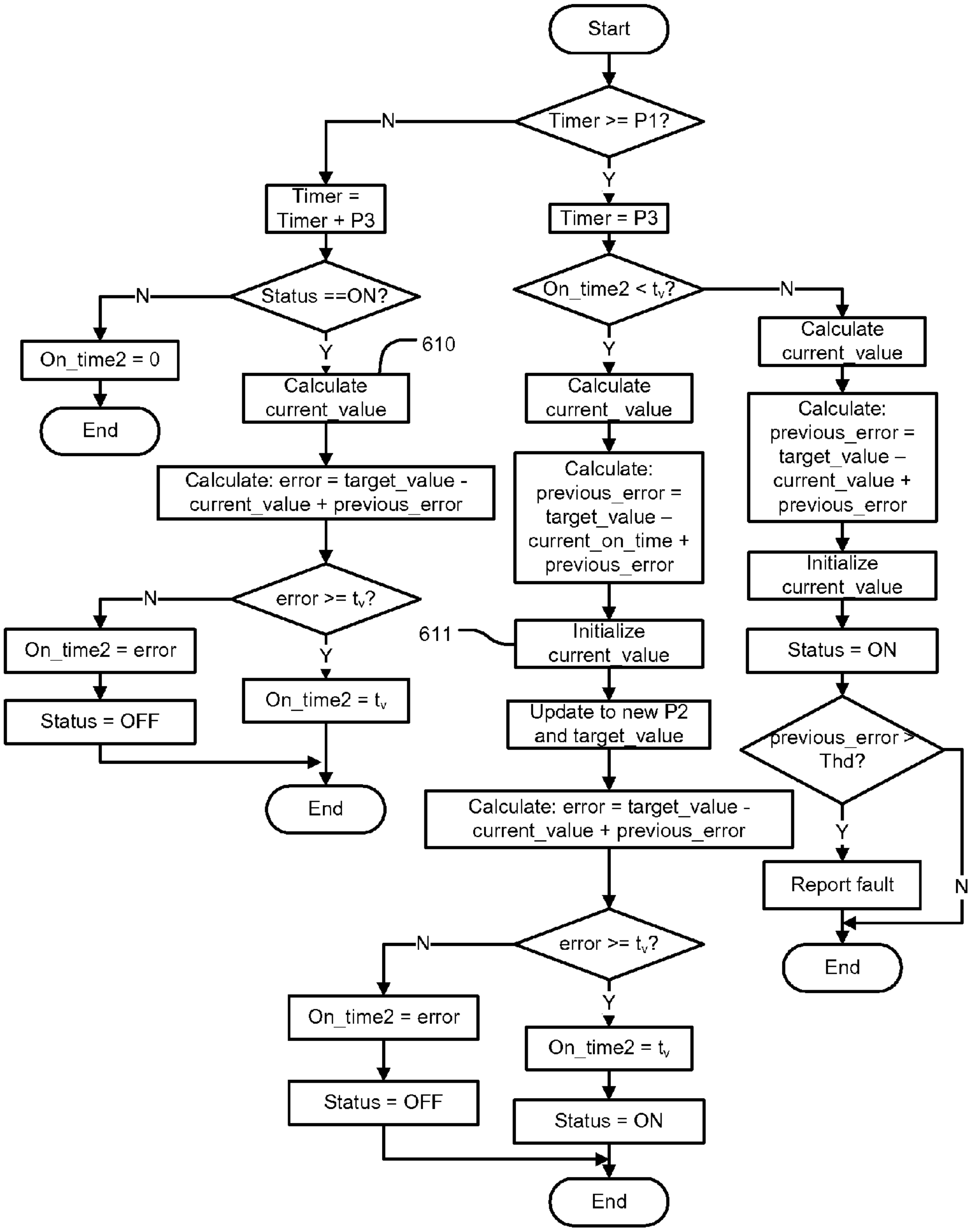
FIG. 6*b* is a flow chart of an interrupt service routine used in the on-time and period determination control of FIG. 6*a*.

The pulse control block 401 can be realized with a service routine running periodically for a timer based interrupt. Referring to FIG. 6*b*, in this routine, $t_v$ and Thd are constant values; P1 is the pulse period value of the first stage PWM signal, and P3 is the interrupt period value. The variable Status is a flag indicating PWM pulse status. When a constant on-time value of $t_v$ is set to the second PWM signal, the Status value is ON, otherwise, it is OFF. The Status is initialized to ON before the service routine starts. The variable target_value contains the target on-time value for the first stage PWM signal, while the variable current_value saves the calculated on-time value of the first stage PWM signal at the current moment. The registers P2 and On_time2 store, respectively, the period (e.g. 501 in FIG. 5*a*) and on-time (e.g 502 in FIG. 5*a*) values in the second stage PWM signal generation, and the variable Timer saves the current time in a first stage PWM cycle.

In the routine of FIG. 6*b*, when the interrupt routine is triggered, the value of Timer is compared to the period value P1 of the first stage PWM signal. If the current cycle is finished, i.e., the value of Timer is greater than or equal to P1, then the on-time value of the second stage PWM signal, On-time2, is examined. When the On_time2 value is lower than $t_v$, the total error of this PWM cycle, i.e., previoius_error, is calculated. And after the Timer value is reset to P3 in a step 611 and the current_value is initialized, the register P2 and the variable target_value are updated for a new cycle, which starts with calculating the error to be corrected in the current cycle by adding the current error to the error in the previous cycle. If the error to be corrected is higher than $t_v$, then the On_time2 value is set to $t_v$ and the Status flag is set to ON, otherwise, the On_time2 value is set to the error value and the Status flag is reset to OFF. The routine ends thereafter. Referring back to the comparison between the Timer value and P1, if the current cycle ends (Timer>=P1) with the On_time2 value not lower than $t_v$, then it means the error cannot be corrected in this PWM cycle. In this case, the error in the previous cycle is calculated and after the Timer is set to P3 and the current_value is initialized. The Status flag is set to ON thereafter. Since the error is not corrected, it is accumulated. When the accumulated error is higher than the threshold Thd, a fault is reported before the routine ends. Referring back the comparison between the Timer value and P1 again, in the current PWM cycle, i.e., when the Timer value is greater than P1, the Timer value is incremented by P3, and then the Status flag is examined. If the Status flag is OFF, then the On_time2 value is cleared to 0, and the routine ends, otherwise, the current_value is calculated and the error is updated thereafter. Before the routine ends, the error value is compared to $t_v$. If the error value is equal or greater than V, then the On_Time2 value is set to $t_v$, otherwise, the On-time2 value is set to the error value and the Status flag is reset to OFF.

Figure 6C:
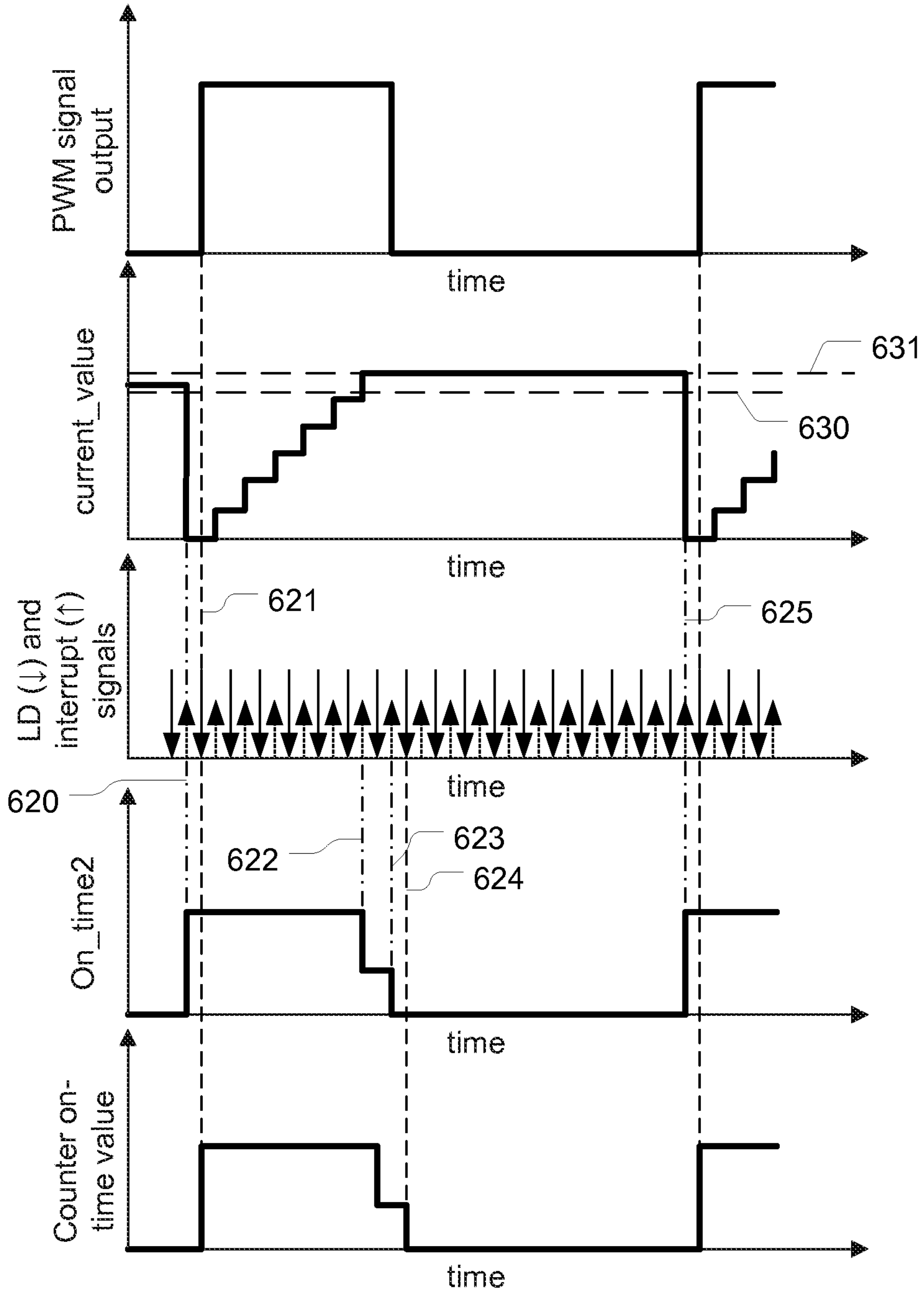
FIG. 6*c* is a timing chart of signals in a PWM signal generation using the interrupt service routine of FIG. 6*b*.

In the interrupt routine, normally $t_v$ is selected greater than the error to be corrected (e.g. $t_v$ equals the value of P2). And the interrupt period value (P3) can be the same as that of the second stage PWM signal (P2). With the interrupt routine of FIG. 6*b*, a signal timing chart when $t_v$ equals to the P3 value and the P2 value is shown in FIG. 6*c*. An interrupt is triggered at a moment 620. Since the error, which is calculated by comparing the value of current_value and a target value 630, is higher than $t_v$, the On_time2 value is set to $t_v$. Upon falling edge of the LD signal, at a moment 621, the On_time2 value is loaded in the on-time counter (e.g. 504 in FIG. 5*a*) and a PWM pulse is triggered. The current_value accumulates with time. At a moment 622, when the calculated error is lower than $t_v$, the error value is assigned to the On_time2 register. In the next interrupt triggered at a moment 623, the On_time2 value is set to 0 and the current_value variable is locked at a value 631. The on-time counter value thereafter is updated at the falling edge of the LD signal at a moment 624, and the PWM pulse is complete. At a moment 625, the current PWM cycle ends, and the previous_error (FIG. 6*b*) is updated for the next cycle by including the error between the current_value value 631 and the target value 630.

In the step 610, the calculation of current_value depends on the way the target value is calculated, and is different in different applications. In the example of water temperature control shown in FIG. 2*a* and FIG. 2*b*, the current_value and the target_value can be calculated according to equation (6). Normally compared to the changes in applied voltage and heater resistance, the change in the function ƒ is small and slow, and therefore, as mentioned above, can be corrected by the PID controller 211. If we just compensate the variations in the applied voltage V and heater resistance R, equation (6) can be further simplified as equation (10) in a PWM control (period is a fixed value):

$$\int_o^{t0} V_0^2/R_0 dt = \int_o^t V^2/R dt \quad (10)$$

In equation (10), $V_0$ and $R_0$ are nominal constants with which the PID controller 211 is tuned, and $t_0$ is the target on-time value calculated from the duty-cycle generated by the PID controller 211. According to equation (10), if we use the total energy generated in a PWM pulse, $\int_o^t V_0^2/R_0 dt$, as the target value, the formula in the interrupt routine for calculating the current_value can be:

$$\text{current\_value}(i)=\text{current\_value}(i-1)+P3*V^2/R \quad (F1),$$

where current_value(0) is set to 0 in the step 611, and i is the number of interrupts after the Timer value is reset to P3:

$$i=\text{Timer}/P3 \quad (F2).$$

Since $V_0$ and $R_0$ are constant, the formula for target_value calculation is $$\text{target\_value}(i)=t_0(i)*V_0*V_0/(R_0*S_0) \quad (F3).$$

If we need to compensate for the perturbations caused by variations in the function ƒ, then the target_value needs to include the target temperature $T_0$, and the current_value can be calculated using the temperature feedback, the applied voltage V and the heater resistance R according to equation (6).

In the example of common rail flow control system shown in FIG. 3*a* and FIG. 3*b*, the total flow amount in a PWM cycle can be used in calculating the target_value. In this case, if a fast flow rate sensor 305 is used, the target_value and current_value can be calculated using the following formula:

$$\text{target\_value}(i)=t_0(i)*mf\_\text{open} \quad (F4)$$

$$\text{current\_value}(i)=mf(i)*P3+\text{current\_value}(i-1) \quad (F5),$$

where mf_open is the nominal full scale mass flow rate when the solenoid valve 303 is open and the rail pressure is at nominal value; mf(i) is the mass flow rate reading value obtained from the flow rate sensor for the calculation in the i-th interrupt cycle, and i is calculated using formula F2. In the step 611, the current_value(0) is initialized to 0.

If the flow rate sensor is not fast enough to measure the flow rate for calculating flow amount in a PWM cycle, then the current_value can be calculated according to equation (9) using pressure sensing values obtained from the sensor 301. In this case, the formula (F4) can be still used in calculating the target_value, and the formula for calculating current_value changes to $$\text{current\_value}(i)=K*sqrt(Pr(i)-Pc))*P3+\text{current\_value}(i-1) \quad (F6).$$

where sqrt is the square root calculation, Pr(i) the rail pressure sensing value for the calculation in the i-th interrupt cycle, and Pc the chamber pressure; K is the term $C'_D A'_n \sqrt{2\rho'}$ in equation (9). Normally compared to the changes in rail pressure, changes in K is much slower and smaller, therefore, as mentioned above, K can be a constant and the variation can be compensated by the PID controller 311. If K needs to be compensated, an identification algorithm using average flow rate sensing values and estimate values based on pressure sensing values calculated according to equation (7) can be used to calculate changes in K:

$$K=\dot{m}_{af}*S/\Sigma_j^n=1(\int_0^{tj}\sqrt{(P_r-P_c)}dt) \quad (11),$$

where S is the total monitoring time of n PWM cycles, and $t_j$ is the nozzle open time in j-th PWM cycle.

In addition to be used in compensating perturbation in a closed loop system, the two-stage pulse control can also be used independently in an open-loop control system. For example, in the water tank temperature control system, if the transfer function ƒ is just slightly affected by ambient conditions, an open-loop control may meet performance requirements. In this case, the two-stage pulse can be used to compensate for temperature variations caused by changes in heater resistance and applied voltage. In the common rail flow rate control system, if the flow rate sensor 305 (FIG. 3*a*) is not available, then an open-loop control has to be used. In the open-loop control, the two-stage pulse control is used to compensate for the effects of variations in rail pressure to the flow rate.

Figure 7A:
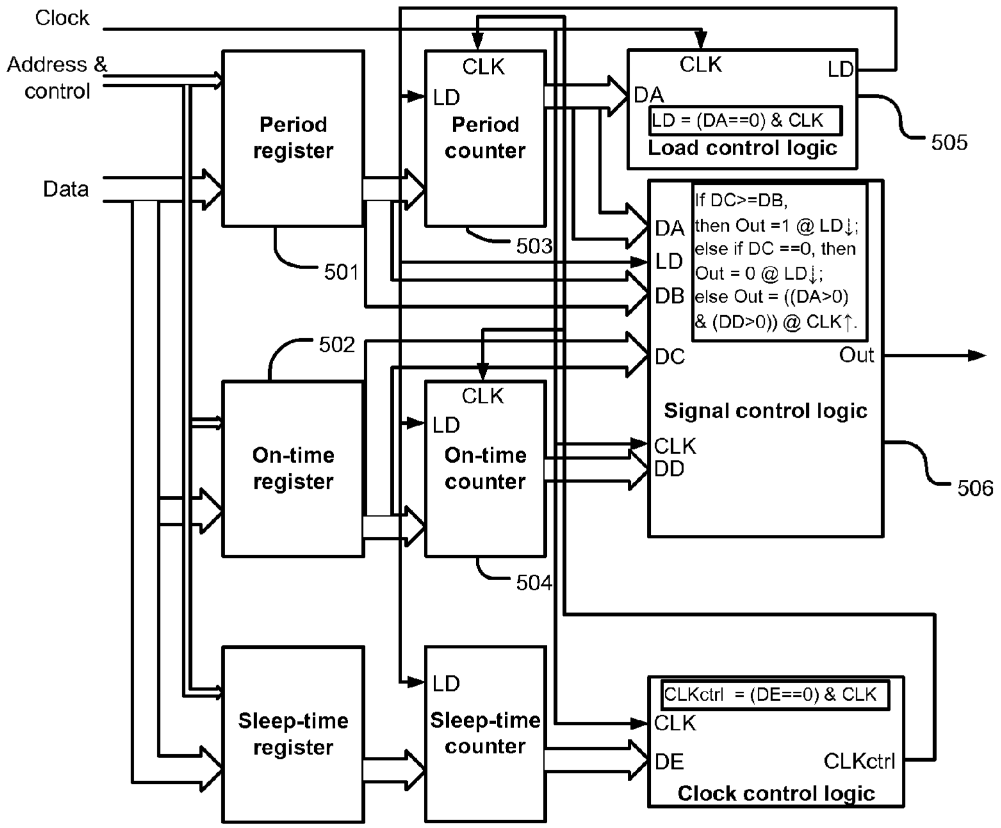
FIG. 7*a* shows a block diagram with signal flow chart of a pulse signal generator circuit generating pulses with a sleep-time section, an on-time section, and an off-time section.

Another embodiment of the two-stage pulse control uses a pulse signal generator adding a sleep time to a PWM cycle. With the pulse signal having a sleep time section and a PWM signal, which includes an on-time section and an off-time section, the previous_error in FIG. 6*a* can be compensated in the current cycle by changing the pulse period rather than being carried over to the next cycle for adjusting the pulse width as in a PWM control, and in an extreme case, a PDM (Pulse-duration Modulation) can be generated. As shown in FIG. 7*a*, in a PWM signal generator of FIG. 5*a*, a sleep time control can be added by using a control logic including a sleep-time register 701, a sleep-time counter 702, and a clock control logic 703 to control the clock signal for the period counter and the on-time counter. The sleep-time counter 702 is a count-down counter and its minimum value is clamped at 0. In sleep time control, sleep time setting for a PWM cycle is saved into the sleep-time register 701 first. Then upon a falling edge of the LD signal, the sleep-time value is loaded into the sleep-time counter 702, which decrements with the clock signal. When the counting value reaches 0, the clock control logic 703 enables the clock signal to the period counter 503 and the on-time counter 504, and a normal PWM signal starts.

Figure 7B:
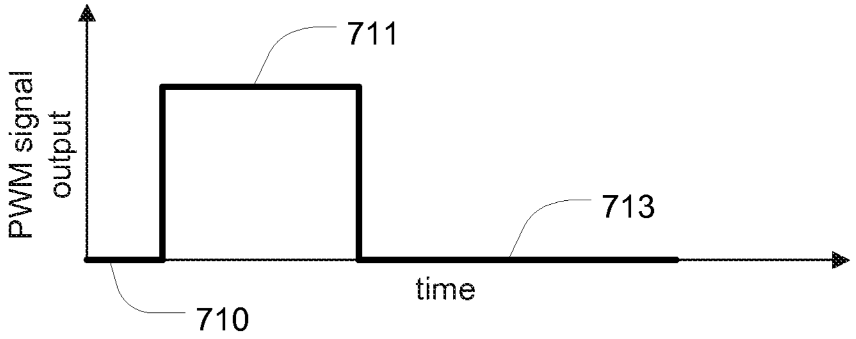
FIG. 7*b* shows a pulse generated by the circuit of FIG. 7*a*.

With the sleep time control, the generated signal is shown in FIG. 7*b*. In the signal, a sleep section 710 is controlled by the value saved in the sleep-time register 701, and the width of a pulse 711 is determined by the value of the on-time register 502. An off-time section 713 is controlled by difference between the value of the period register 501 and that of the on-time register 502, and the overall duration of the signal is the sum of the value of the period register 501 and that of the sleep-time register 701.

Figure 8A:
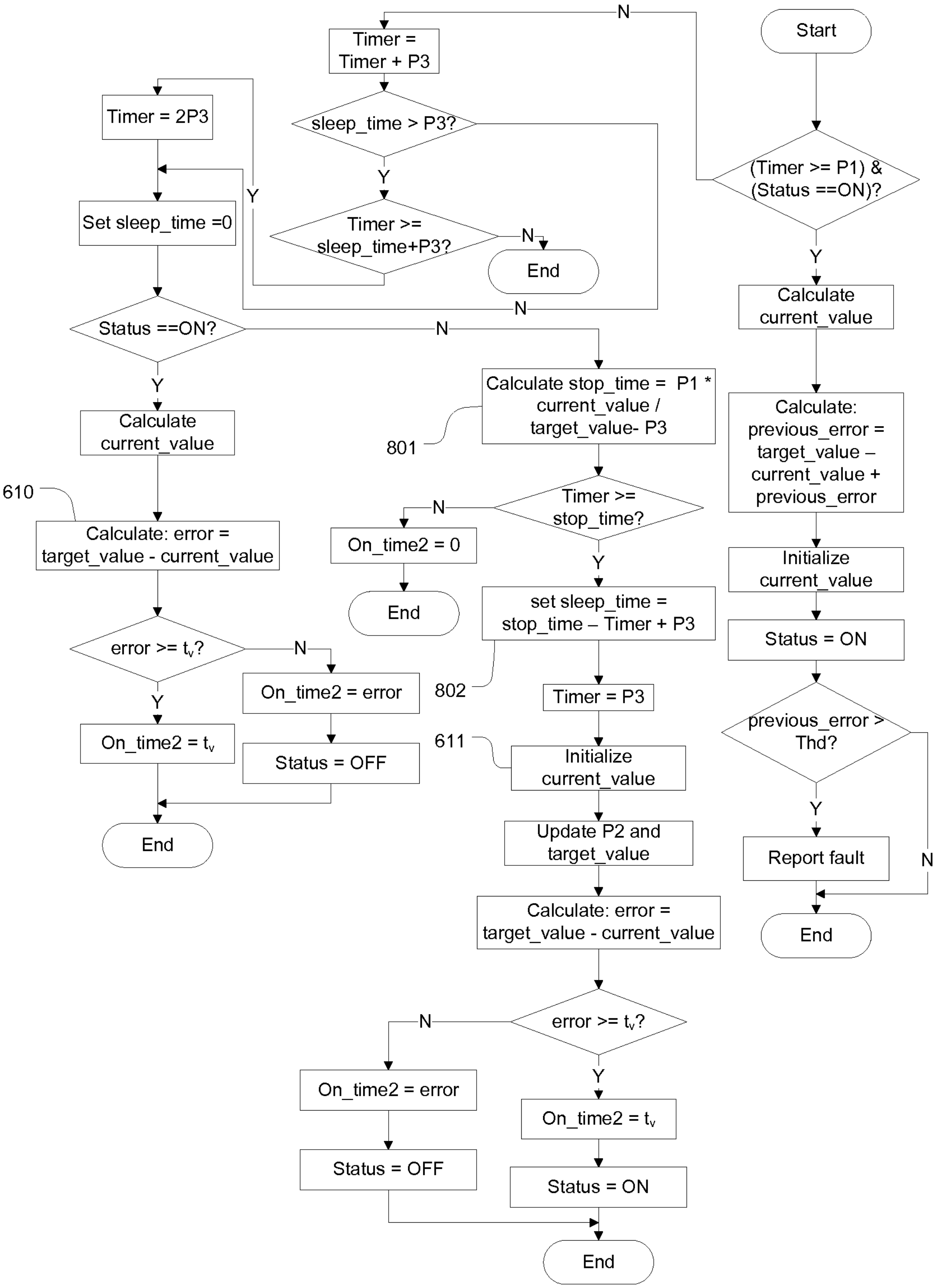
FIG. 8*a* is a flow chart of an interrupt service routine used in a two-stage pulse signal generation for correcting errors by adjusting the pulse duration of control signals.

A service routine for a timer based interrupt can be used for generating a pulse signal with a sleep time and a PWM signal. A flow chart of this service routine is shown in FIG. 8*a*. Compared to the interrupt service routine of FIG. 6*a*, in FIG. 8*a*, except in a fault processing branch, where the target_value cannot be reached even with 100% duty cycle, previous_error is not calculated. Instead, a stop_time and a sleep_time are calculated in a step 801 and a step 802 respectively. The stop_time is to determine the second stage pulse cycle to set sleep time, and the sleep_time is the value to be set. To correct an error in the first stage pulse, we need to make corrected average value equal to the target one, i.e., $$\text{target\_value}/P1=\text{current\_value}/(Ts+\text{sleep\_time}) \quad (12),$$

where Ts is the time period from the beginning of a first stage PWM cycle to the moment when the sleep time is set, and current_value is the control value at the moment when the sleep time is set. According to the equation (12), the sleep_time can be calculated using the following equation:

$$\text{sleep\_time}=P1*\text{current\_value}/\text{target\_value}-Ts \quad (13),$$

and the stop_time then is determined by:

$$\text{stop\_time}=Ts+\text{sleep\_time}-P3 \quad (14).$$

In the PWM signal generator of FIG. 7*a*, the new on-time, period, and sleep-time values cannot be loaded to counters before a cycle including sleep time finishes. Therefore, to synchronize the Timer value with the second stage PWM cycles, we need to wait for the cycle to finish. As shown in FIG. 8*a*, before we calculate current_value after the Status flag being set ON, the Timer value is compared to the sum of the sleep_time value and P3. The Timer is set to 2*P3 when the Timer value is greater than the sum, and then sleep_time is set to 0.

Figure 8B:
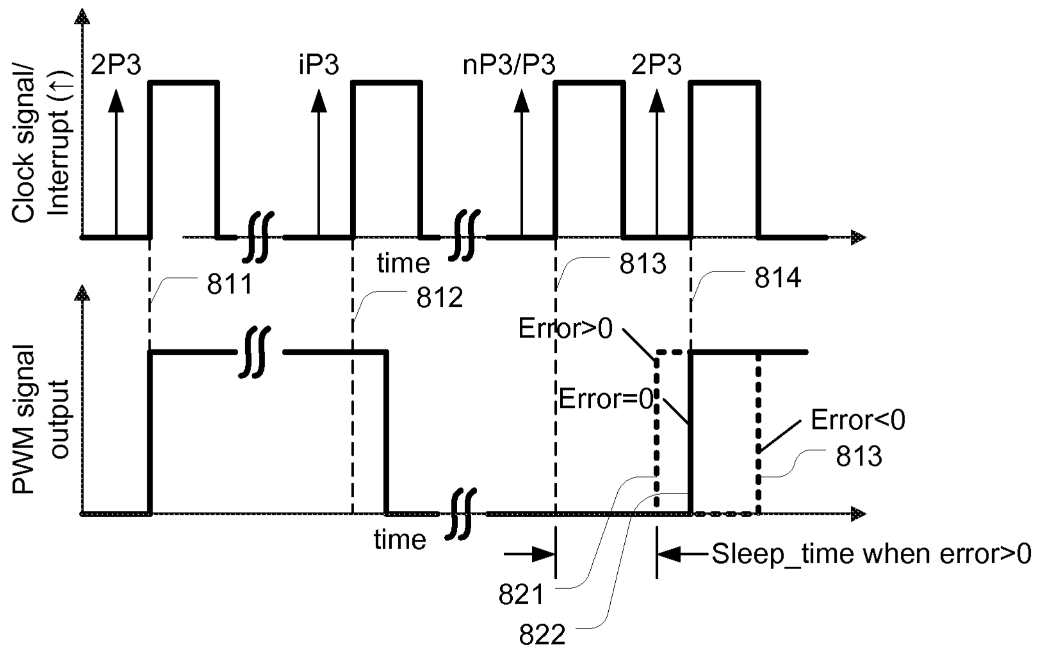
FIG. 8*b* is a timing chart of signals in a pulse signal generation using the interrupt service routine of FIG. 8*a*.

The timing chart when an interrupt service routine of FIG. 8*a* is used is shown in FIG. 8*b*. At a moment 811, a second stage PWM signal with the On_time2 value set to $t_v$ is generated with the setting generated in the previous interrupt, in which the Timer value is set to 2*P3. At a moment 812, a second stage PWM signal with the On_time2 value set to the error value is triggered and in its previous interrupt, the Timer value is set to i*P3. When the Timer value is set to n*P3, a sleep_time is generated to correct the error in the current PWM cycle. If the error is 0, then the next PWM cycle starts at a moment 814, otherwise, it starts at a moment 821 or a moment 813 depending on the sign of the error.

Figure 9:
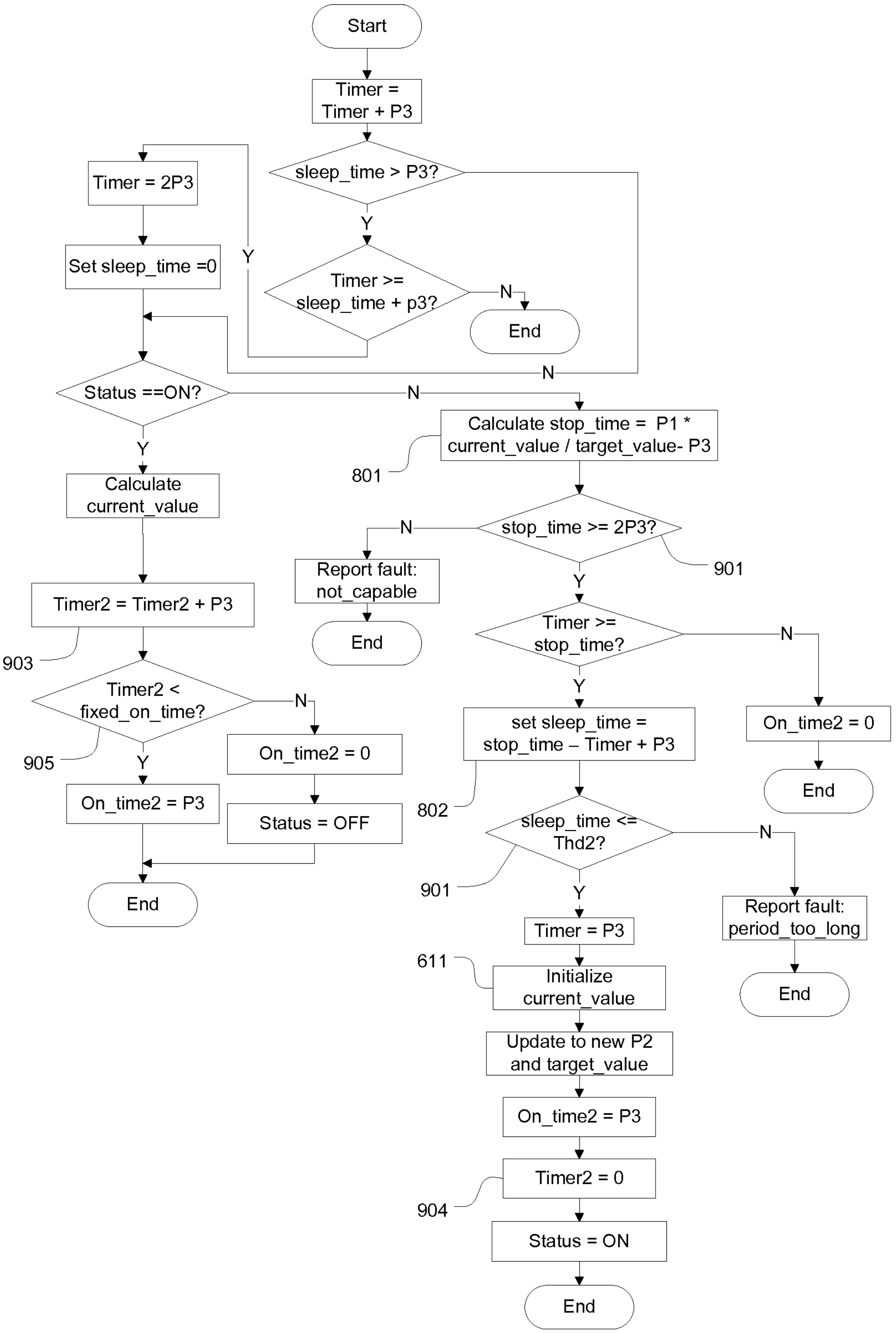
FIG. 9 is a flow chart of an interrupt service routine used in a two-stage pulse signal generation for generating pulse duration modulated control signals.

Using the PWM signal generator of FIG. 7*a*, if the on time of the signal generated with the interrupt routine of FIG. 8*a* is constant, then the first stage PWM signal then becomes a PDM (Pulse Duration Modulated) signal. An exemplary interrupt routine for generating a PDM signal is shown in FIG. 9. In this routine, in steps 903, 904, and 905, a timer (Timer2) is used to calculate the fixed pulse width of the PDM, and the period of the PDM is determined by the stop_time and the sleep_time in steps 801 and 802. The stop_time and the sleep_time can also be used to detect system issues. In a step 901, if the stop_time value is lower than 2*P3, then it means even at the highest capacity of the control signal, the system cannot reach the target_value, and therefore, a not_capable fault is triggered. In a step 902, if the sleep_time is greater than a threshold Th2, then a period_too_long fault is triggered, since it needs to long period to reach the target_value.

While the present invention has been depicted and described with reference to only a limited number of particular preferred embodiments, as will be understood by those of skill in the art, changes, modifications, and equivalents in form and function may be made to the invention without departing from the essential characteristics thereof. For example, a different circuit can be used in the PWM signal generator. Furthermore, the two-stage PWM control can be used in a variety of applications, such as humidity control, pressure control, position control, and speed control. Accordingly, the invention is intended to be only limited by the spirit and scope as defined in the appended claims, giving full cognizance to equivalents in all respects.

What is claimed:

1. A control apparatus for energizing and de-energizing a device to control an output value of said device according to a predetermined target value, comprising:

a switching means controlling an energizing time and a de-energizing time of said device;

at least one parameter sensor for providing parameter sensing values indicative to changes in parameters of a transfer function between a ratio of said energizing time to said de-energizing time and said output value; and a pulse signal controller for providing a PWM control signal to said switching means, including a first stage controller providing values of control parameters for a second stage controller according to at least said predetermined target value and said parameter sensing values obtained from said at least one parameter sensor, wherein said second stage controller is further configured to generate a second stage PWM signal, and said first stage controller is further configured to generate a first stage PWM control signal by periodically providing values of control parameters for said second stage controller, and at least two cycles of said second stage PWM signal are generated in one cycle of said first stage PWM signal.

2. The control apparatus of claim 1, wherein in each cycle of said first stage PWM signal, in all cycles of said second stage PWM signal with non-zero on-time, at least one cycle has its control parameters determined in a different way from other cycles.

3. The control apparatus of claim 2, wherein said at least one cycle of said second stage PWM signal is after said other cycles of said second stage PWM signal.

4. The control apparatus of claim 1, wherein said pulse signal controller is configured to report a fault if in a predetermined number of cycles of said first stage PWM signal, all cycles of said second stage PWM signal with non-zero on-time are determined in the same way.

5. The control apparatus of claim 1, wherein said device is a power supply, and said parameters of said transfer function include a voltage of said power supply.

6. The control apparatus of claim 1, wherein said device is a common rail flow control device including a rail with a working fluid contained inside, and said parameters of said transfer function include a pressure of said working fluid in said rail of said common rail flow control device.

7. The control apparatus of claim 1, further comprising:

at least one output sensor providing output sensing values indicative to said output value of said device, wherein said first stage controller is further configured to provide values of control parameters for said second stage PWM signal according to at least said output sensing values obtained from said output sensor.

8. A control apparatus for energizing and de-energizing a device to control an output value of said device according to a predetermined target value, comprising:

a switching means controlling an energizing time and a de-energizing time of said device;

at least one parameter sensor for providing parameter sensing values indicative to changes in parameters of a transfer function between a ratio of said energizing time to said de-energizing time and said output value; and a pulse signal controller for providing a pulse control signal to said switching means, including a first stage controller providing values of control parameters for a second stage controller according to at least said predetermined target value and said parameter sensing values obtained from said at least one parameter sensor, wherein said second stage controller is further configured to generate a second stage pulse signal, each pulse in which includes a sleep time section, an on-time section, and an off-time section, and said first stage controller is further configured to generate a first stage pulse signal, each cycle of which includes at least two second stage pulses, by setting values of said control parameters for said second stage controller in each cycle of said second stage pulse signal.

9. The control apparatus of claim 8, wherein in each cycle of said first stage pulse signal, in all cycles of said second stage pulse sequence signal with non-zero on-time, at least one cycle has its control parameters determined in a different way from other cycles.

10. The control apparatus of claim 8, wherein in each cycle of said first stage pulse signal, in all cycles of said second stage pulse signal, at least one cycle has its sleep time determined in a different way from other cycles.

11. The control apparatus of claim 8, wherein said device is a power supply, and said parameters of said transfer function include a voltage of said power supply.

12. The control apparatus of claim 8, wherein said device is a common rail flow control device including a rail with a working fluid contained inside, and said parameters of said transfer function include a pressure of said working fluid in said rail of said common rail flow control device.

13. The control apparatus of claim 8, wherein said pulse signal generator is configured to report a fault if in a predetermined number of cycles of said first stage pulse signal, all cycles of said second stage pulse signal with non-zero on-time are determined in the same way.

14. The control apparatus of claim 8, wherein said first stage pulse signal is a pulse duration modulated signal.

15. The control apparatus of claim 14, wherein in each cycle of said first stage pulse signal, in all cycles of said second stage pulse signal, at least one cycle has its sleep time determined in a different way from other cycles.

16. The control apparatus of claim 14, wherein said pulse signal controller is configured to report a fault if said sleep time of said second stage pulse signal is calculated longer than a predetermined threshold value.

17. A method for controlling an apparatus including a control device, a switching means controlling an energizing time and a de-energizing time of said control device, a pulse signal controller for generating a pulse signal to said switching means, and at least one sensor, comprising steps of:

(a) calculating a current control value using sensing values obtained from said at least one sensor;

(b) calculating an error by subtracting said current control value from a predetermined target value;

(c) updating parameters of said pulse signal controller in each cycle of said pulse signal by setting said parameters to a first set of values in a cycle of said pulse signal when said error is greater than a predetermined value, and setting said parameters to a second set of values in a cycle of said pulse signal and setting said parameters to a third set of values in a following cycle otherwise;

(d) generating a fault signal when said second set of values are not set in a predetermined period of time;

(e) initializing said current control value after setting parameters to said third set of values; and (f) repeating steps (a) to (e).

18. The method of claim 17, wherein said pulse signal controller generates a PWM signal, and said parameters of said pulse signal controller determine a duty cycle of said PWM signal.

19. The method of claim 17, wherein said pulse signal controller generates a PWM signal with a sleep-time section, and said parameters of said pulse signal controller determine a duration time of said sleep section and a duty cycle of said PWM signal.

* * * * *